(12) United States Patent
Won et al.

(10) Patent No.: US 9,431,515 B2
(45) Date of Patent: Aug. 30, 2016

(54) METHODS OF FORMING SEMICONDUCTOR DEVICES, INCLUDING PERFORMING A HEAT TREATMENT AFTER FORMING A METAL LAYER AND A HIGH-K LAYER

(71) Applicant: Samsung Electronics Co., Ltd., Suwon-si (KR)

(72) Inventors: Seok-Jun Won, Seoul (KR); Weon-Hong Kim, Suwon-si (KR); Moon-Kyun Song, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/640,058

(22) Filed: Mar. 6, 2015

(65) Prior Publication Data

US 2016/0013107 A1  Jan. 14, 2016

(30) Foreign Application Priority Data

Jul. 11, 2014  (KR) ........................ 10-2014-0087307

(51) Int. Cl.
| | |
|---|---|
| H01L 21/8238 | (2006.01) |
| H01L 29/66 | (2006.01) |
| H01L 21/28 | (2006.01) |
| H01L 21/321 | (2006.01) |
| H01L 29/49 | (2006.01) |
| H01L 29/51 | (2006.01) |

(52) U.S. Cl.
CPC ... *H01L 29/66545* (2013.01); *H01L 21/28088* (2013.01); *H01L 21/28176* (2013.01); *H01L 21/28194* (2013.01); *H01L 21/28202* (2013.01); *H01L 21/321* (2013.01); *H01L 21/823842* (2013.01); *H01L 21/823857* (2013.01); *H01L 29/4966* (2013.01); *H01L 29/517* (2013.01); *H01L 29/513* (2013.01)

(58) Field of Classification Search
CPC ................ H01L 21/823828; H01L 21/28088; H01L 21/321; H01L 21/324; H01L 29/66545
See application file for complete search history.

(56) References Cited

U.S. PATENT DOCUMENTS

| | | | | |
|---|---|---|---|---|
| 6,297,153 B1 * | 10/2001 | Park | ................... | H01L 21/76843 257/E21.584 |
| 6,392,280 B1 * | 5/2002 | Besser | .............. | H01L 21/28194 257/295 |
| 6,645,818 B1 * | 11/2003 | Sing | ................... | H01L 21/82384 257/E21.635 |
| 7,531,404 B2 * | 5/2009 | Pae | .................... | H01L 21/28185 438/211 |
| 7,955,925 B2 * | 6/2011 | Okada | ................. | H01L 21/0206 257/384 |
| 8,664,070 B2 * | 3/2014 | Liu | .................... | H01L 21/28518 438/301 |
| 2003/0129817 A1 * | 7/2003 | Visokay | ............ | H01L 21/28185 438/591 |
| 2003/0235990 A1 * | 12/2003 | Wu | ................... | H01L 21/28061 438/694 |

(Continued)

FOREIGN PATENT DOCUMENTS

| | | |
|---|---|---|
| JP | 08-306778 | 11/1996 |
| JP | 2004-228324 | 8/2004 |

(Continued)

*Primary Examiner* — Matthew Landau
*Assistant Examiner* — Grant Withers
(74) *Attorney, Agent, or Firm* — Myers Bigel & Sibley, P.A.

(57) ABSTRACT

Methods of forming semiconductor devices are provided. A method of forming a semiconductor device includes forming an insulating layer that includes a trench therein. The method includes forming a high-k layer in the trench. Moreover, the method includes forming a metal layer on the high-k layer, then performing a first heat treatment at a first temperature, and performing a second heat treatment at a second temperature that is higher than the first temperature.

20 Claims, 19 Drawing Sheets

(56) References Cited

U.S. PATENT DOCUMENTS

| | | | | |
|---|---|---|---|---|
| 2004/0198045 A1* | 10/2004 | Chen | C23C 16/0209 | 438/685 |
| 2005/0037613 A1* | 2/2005 | Grunow | H01L 21/76856 | 438/643 |
| 2007/0138559 A1* | 6/2007 | Bohr | H01L 21/28088 | 257/351 |
| 2008/0079084 A1* | 4/2008 | Hanafi | H01L 21/28052 | 257/369 |
| 2010/0240180 A1* | 9/2010 | Jeon | H01L 21/82343 | 438/239 |
| 2010/0330808 A1* | 12/2010 | Richter | H01L 21/82380 | 438/691 |
| 2011/0081774 A1* | 4/2011 | Yeh | H01L 21/82383 | 438/591 |
| 2011/0186937 A1* | 8/2011 | Scheiper | H01L 21/28088 | 257/402 |
| 2011/0210398 A1* | 9/2011 | Beyer | H01L 21/82380 | 257/368 |
| 2011/0309449 A1* | 12/2011 | Ando | H01L 21/28088 | 257/369 |
| 2012/0126310 A1* | 5/2012 | Yin | H01L 21/82341 | 257/329 |
| 2012/0264281 A1* | 10/2012 | Chen | H01L 21/82343 | 438/591 |
| 2012/0282765 A1* | 11/2012 | Pfutzner | H01L 21/82343 | 438/586 |
| 2012/0329262 A1* | 12/2012 | Na | H01L 21/82384 | 438/595 |
| 2013/0017678 A1* | 1/2013 | Tsai | H01L 21/28088 | 438/591 |
| 2013/0034942 A1* | 2/2013 | Pal | H01L 21/82380 | 438/285 |
| 2013/0056836 A1* | 3/2013 | Yu | H01L 21/82380 | 257/410 |
| 2013/0115773 A1* | 5/2013 | Pal | H01L 21/84 | 438/697 |
| 2014/0070327 A1* | 3/2014 | Niimi | H01L 27/092 | 257/369 |
| 2014/0141598 A1* | 5/2014 | Ando | H01L 29/4232 | 438/478 |
| 2014/0315365 A1* | 10/2014 | Chen | H01L 21/32134 | 438/299 |
| 2014/0367788 A1* | 12/2014 | Xie | H01L 27/092 | 257/369 |
| 2015/0069518 A1* | 3/2015 | Han | H01L 27/092 | 257/369 |
| 2015/0187771 A1* | 7/2015 | Niimi | H01L 21/02164 | 257/369 |
| 2015/0255277 A1* | 9/2015 | Tong | H01L 29/785 | 257/288 |
| 2015/0255463 A1* | 9/2015 | Ando | H01L 29/36 | 257/371 |
| 2015/0279744 A1* | 10/2015 | Kwon | H01L 21/82382 | 438/585 |

FOREIGN PATENT DOCUMENTS

| | | |
|---|---|---|
| JP | 2013-058565 | 3/2013 |
| KR | 1020000043896 A | 7/2000 |
| KR | 1020030003322 A | 1/2003 |
| KR | 1020030050182 A | 6/2003 |
| KR | 1020080114156 A | 12/2008 |

* cited by examiner

METHODS OF FORMING SEMICONDUCTOR DEVICES, INCLUDING PERFORMING A HEAT TREATMENT AFTER FORMING A METAL LAYER AND A HIGH-K LAYER

CROSS-REFERENCE TO RELATED APPLICATION

This U.S. non-provisional patent application claims priority under 35 U.S.C. §119 to Korean Patent Application No. 10-2014-0087307, filed on Jul. 11, 2014, in the Korean Intellectual Property Office, the disclosure of which is hereby incorporated herein in its entirety by reference.

BACKGROUND

The present disclosure relates to methods of forming semiconductor devices. As the feature size of a Metal Oxide Semiconductor (MOS) transistor decreases, the length of a gate and the length of a channel that is formed below the gate may become shortened. Accordingly, research has been conducted to increase capacitance between the gate and the channel and to improve operation characteristics of the MOS transistor.

As the thickness of a silicon oxide layer that is mainly used as a gate insulating layer is reduced, the electrical properties thereof may approach a physical limit. Accordingly, for replacement of an existing silicon oxide layer, research for a high-k layer having a high dielectric constant has been conducted. The high-k layer can reduce leakage current between a gate electrode and a channel region while maintaining the thickness of a thin equivalent oxide layer.

Further, polysilicon that is mainly used as a gate material may have a higher resistance than the resistance of most metal materials. Accordingly, a polysilicon gate electrode may be replaced by a metal gate electrode.

SUMMARY

Various embodiments of present inventive concepts may provide a method for fabricating a semiconductor device having high reliability. For example, according to various embodiments of present inventive concepts, a method for fabricating a semiconductor device may include forming an interlayer insulating layer including a trench therein on a substrate. In some embodiments, the method may include forming a high-k layer in the trench. In some embodiments, the method may include forming a first metal layer on the high-k layer. In some embodiments, the method may include performing a first heat treatment with respect to the high-k layer and the first metal layer at a first temperature when a surface of the first metal layer is exposed. In some embodiments, the method may include performing a second heat treatment using a peak second temperature that is higher than the first temperature with respect to the high-k layer when the surface of the first metal layer is exposed. Moreover, the method may include forming a second metal layer on the first metal layer.

In various embodiments, performing the second heat treatment may include maintaining the peak second temperature for about 100 microseconds to about 1 second. In some embodiments, the peak second temperature may be about 800° C. to about 1200° C., and performing the second heat treatment may include performing the second heat treatment using the peak second temperature of about 800° C. to about 1200° C.

According to various embodiments, the first metal layer may include metal nitride, and forming the first metal layer may include forming the metal nitride on the high-k layer. In some embodiments, the metal nitride may include Titanium Nitride (TiN), Tantalum Nitride (TaN), Tungsten Nitride (WN), or a combination thereof. Moreover, the second metal layer may include a material that is different from the metal nitride of the first metal layer.

In various embodiments, performing the first heat treatment may include performing the first heat treatment using ammonia ($NH_3$) gas. Alternatively, performing the first heat treatment may include performing the first heat treatment using nitrogen ($N_2$) plasma.

According to various embodiments, performing the second heat treatment may include performing the second heat treatment using spike rapid thermal annealing (sRTA), a laser anneal, a flash anneal, or a combination thereof. In some embodiments, performing the first and second heat treatments may include performing the first and second heat treatments through an in-situ process. Moreover, in some embodiments, the method may include forming a dummy gate on the substrate, forming a spacer on a side of the dummy gate, and forming the trench in the interlayer insulating layer by removing the dummy gate.

A method for fabricating a semiconductor device, according to various embodiments, may include providing a substrate that includes a first region and a second region. The method may include forming an interlayer insulating layer that includes a first trench and a second trench on the first region and the second region, respectively. The method may include forming a high-k layer in the first trench and the second trench. The method may include forming a first metal layer on the high-k layer. The method may include performing a first heat treatment with respect to the high-k layer at a first temperature when a surface of the first metal layer is exposed. The method may include performing a second heat treatment using a peak second temperature that is higher than the first temperature with respect to the high-k layer when the surface of the first metal layer is exposed. The method may include forming a second metal layer on the first metal layer. Moreover, the method may include removing the second metal layer from the first metal layer of the first region while at least a portion of the second metal layer remains on the first metal layer of the second region.

In various embodiments, the method may include forming an etch protection layer that includes Tantalum Nitride (TaN), on the first metal layer in the first and second regions, before forming the second metal layer. Moreover, forming the second metal layer may include forming the second metal layer on the etch protection layer of the first and second regions, and removing the second metal layer may include selectively removing the second metal layer from the first region by wet etching.

According to various embodiments, the second metal layer may include a first conductivity type work function adjustment layer, and the method may include forming a second conductivity type work function adjustment layer on the etch protection layer of the first region and the second metal layer of the second region. Moreover, the first conductivity type may be P-type, and the second conductivity type may be N-type.

A method of forming a semiconductor device, according to various embodiments, may include forming a high-k layer in a trench in an insulating layer. The method may include forming a metal layer on the high-k layer in the trench. The method may include performing a first heat treatment using a first temperature, after forming the metal layer on the high-k layer in the trench. Moreover, the method may include performing a second heat treatment using a second temperature that is higher than the first temperature of the first heat treatment, after performing the first heat treatment.

In various embodiments, the method may include forming an interface layer in the trench before forming the high-k layer in the trench. In some embodiments, the second temperature may be a peak temperature of about 800° C. to about 1200° C., and performing the second heat treatment may include performing the second heat treatment using the peak temperature of about 800° C. to about 1200° C. for about 100 microseconds to about 1 second.

According to various embodiments, the metal layer may include a first metal layer, and the method may include forming a second metal layer in the trench after performing the first and second heat treatments, forming a P-type work function adjustment layer after forming the second metal layer, and forming an N-type work function adjustment layer on the P-type work function adjustment layer.

In various embodiments, the trench may be a first trench, and the semiconductor device may include a second trench in the insulating layer. Moreover, the metal layer may include a first metal layer, and the method may include forming a second metal layer in the first and second trenches and completely removing the second metal layer from the first trench without completely removing the second metal layer from the second trench.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
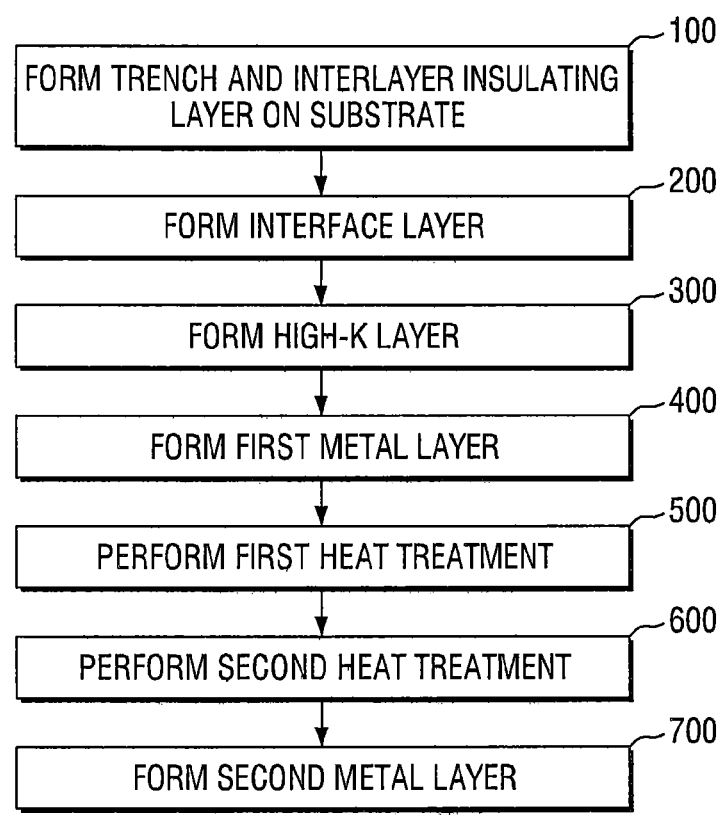
FIG. 1 is a flowchart illustrating a method for fabricating a semiconductor device according to various embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Referring to FIGS. 1 to 9, a method for fabricating a semiconductor device according to various embodiments of present inventive concepts will be described.

FIG. 1 is a flowchart illustrating a method for fabricating a semiconductor device according to various embodiments of present inventive concepts, and FIGS. 2 to 9 are views of intermediate steps explaining a method for fabricating a semiconductor device according to various embodiments of present inventive concepts. FIG. 10 is a time-temperature graph explaining first and second heat treatment processes in a method for fabricating a semiconductor device according to various embodiments of present inventive concepts.

Figure 2:
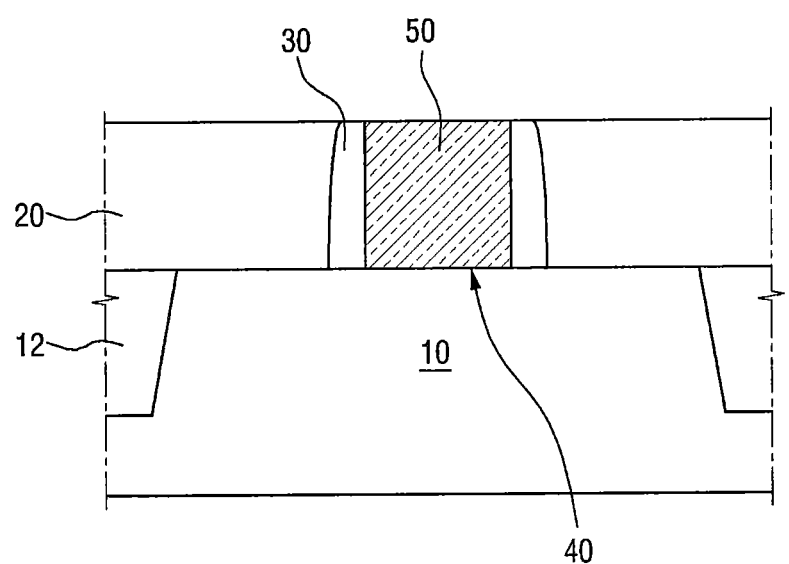
FIGS. 2 to 9 are views of intermediate steps explaining a method for fabricating a semiconductor device according to various embodiments of present inventive concepts.
Figure 3:
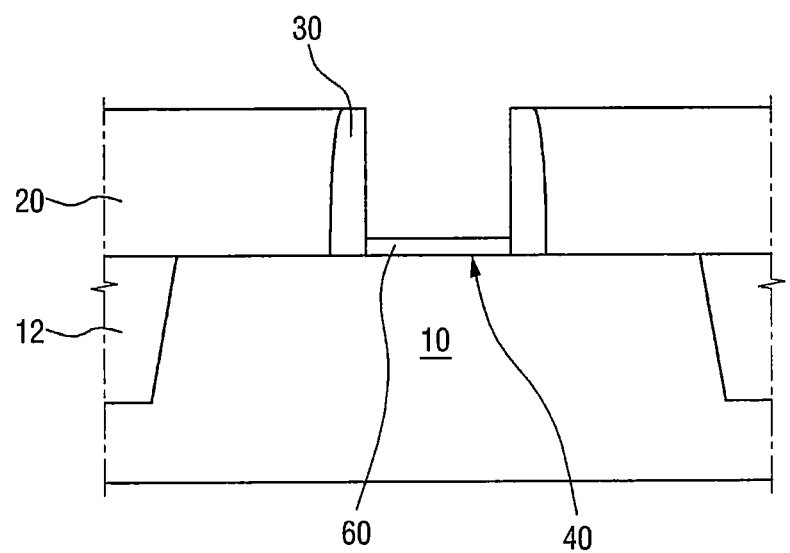

Referring to FIGS. 1 to 3, a trench and an interlayer insulating layer are formed on a substrate (Block 100).

The substrate 10 may be a rigid substrate, such as a silicon substrate, a SOI (Silicon On Insulator) substrate, a gallium arsenide substrate, a silicon germanium substrate, a ceramic substrate, a quartz substrate, or a glass substrate for display, or a flexible plastic substrate made of polyimide, polyester, polycarbonate, polyethersulfone, polymethylmethacrylate, polyethylenenaphthalate, or polyethyleneterephthalate.

An isolation layer 12 may be formed on the substrate 10. The isolation layer 12 is formed in the substrate 10 to define an active region. The isolation layer 12 has superior isolation characteristics and a small area of occupancy, and thus can be formed in a shallow trench isolation (STI) structure that is advantageous in high integration, but is not limited thereto. The isolation layer 12 may include, for example, at least one of silicon oxide, silicon nitride, silicon oxynitride, and a combination thereof.

A dummy gate insulating layer and a dummy gate 50 may be sequentially formed on the substrate 10 and the isolation layer 12. The dummy gate insulating layer may be created/formed such that it will be on a lower portion of the dummy gate 50 after the dummy gate 50 is formed thereon. The dummy gate insulating layer may be, for example, a nitrided layer to heighten dielectric constant. In some embodiments of present inventive concepts, the dummy gate insulating layer may be a silicon oxynitride (SiON) layer that is formed through nitridation of a silicon oxide ($SiO_2$) layer to heighten the dielectric constant, but is not limited thereto. The dummy gate 50 may be made of, for example, polysilicon, but it is not limited thereto.

After being sequentially formed, the dummy gate insulating layer and the dummy gate 50 are patterned. Then, a spacer 30 is formed along side walls of the patterned dummy gate insulating layer and dummy gate 50, starting from upper portions thereof.

FIG. 2 illustrates that the spacer 30 is formed in a bar shape, but is not limited thereto. In some embodiments of present inventive concepts, the shape of the spacer 30 may be modified in various manners, such as in an "L" shape.

After the spacer 30 is formed, a source and a drain are formed through injection of impurities into the substrate 10. In this case, the impurity injection may be performed using ion implantation, but is not limited thereto.

Then, an interlayer insulating layer 20 is formed on the substrate 10. In this case, the interlayer insulating layer 20 may be formed to cover the spacer 30 that is formed on an upper portion of the dummy gate 50. Thereafter, the interlayer insulating layer 20 that is formed on the upper portion of the dummy gate 50 is planarized until the upper portion of the dummy gate 50 is exposed to complete the dummy gate 50 and the spacer 30 as illustrated in FIG. 2.

Then, the dummy gate 50 that is formed on the dummy gate insulating layer is removed through a wet etching process or the like. In such an etching process to remove the dummy gate 50, an etching solution having an etching selection ratio with respect to the spacer 30 and the dummy gate insulating layer may be used. Then, the dummy gate insulating layer is removed using, for example, COR (Chemical Oxide Removal) or the like.

Once the dummy gate insulating layer is removed, the upper surface of the substrate 10 may be exposed, but present inventive concepts are not limited thereto. If another functional layer is formed on a lower portion of the dummy gate insulating layer, an upper surface of the functional layer may be exposed.

As described above, once the dummy gate 50 and the dummy gate insulating layer are removed, the upper surface of the substrate 10, on which the dummy gate 50 and the dummy gate insulating layer were positioned, may be exposed to complete a trench 40. As illustrated, the spacer 30 may be formed on a side wall of the trench 40 and the substrate 10 may be arranged on a bottom surface of the trench 40, but present inventive concepts are not limited thereto.

Next, referring to FIG. 1, an interface layer is formed (Block 200).

Figure 4:
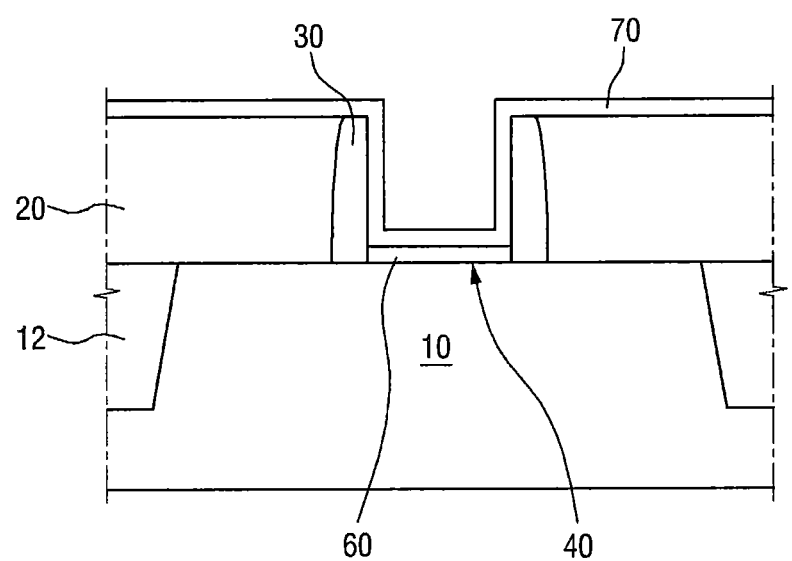

Specifically, referring to FIGS. 3 and 4, the interface layer 60 may be formed through oxidization of the upper surface of the substrate 10, but present inventive concepts are not limited thereto. As indicated in FIG. 4, the interface layer 60 may serve to prevent/protect against an inferior interface between the substrate 10 and a first high-k layer 70. The interface layer 60 may include a low-k material layer having dielectric constant k of 9 or less, for example, a silicon oxide layer ($SiO_2$, where k is about 4) or a silicon oxynitride layer (where k is about 4 to 8, depending on the content of oxygen atoms and nitrogen atoms). Further, the interface layer 60 may be made of silicate, or may be made of a combination of the layers as discussed in examples above.

Referring again to FIG. 1, a first high-k layer is formed (Block 300).

Specifically, referring to FIG. 4, the high-k layer 70 may be made of a material having higher dielectric constant than the dielectric constant of the interface layer 60. In some embodiments of present inventive concepts, the high-k layer 70 may be made of, for example, a material such as Hafnium Oxide ($HfO_2$), Aluminum Oxide ($Al_2O_3$), Zirconium Dioxide ($ZrO_2$), or Tantalum Oxide ($TaO_2$), but is not limited thereto. The high-k layer 70 is conformally formed along the upper surface of the interlayer insulating layer 20 and the side wall(s) and the bottom surface of the trench 40. The high-k layer 70 may be formed with an appropriate thickness depending on the kind/type of the device to be formed.

Referring again to FIG. 1, a first metal layer is formed (Block 400).

Figure 5:
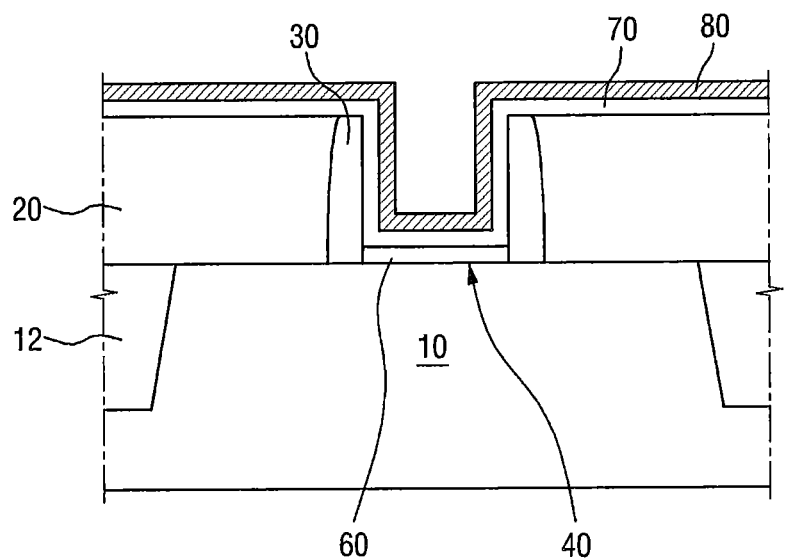

Specifically, referring to FIG. 5, the first metal layer 80 may be formed on the high-k layer 70 in the trench 40. As illustrated, the first metal layer 80 may be conformally formed along the side wall(s) and the bottom surface of the trench 40. The first metal layer 80 may include metal nitride. For example, the first metal layer 80 may include Titanium Nitride (TiN), Tantalum Nitride (TaN), Tungsten Nitride (WN), or a combination thereof, and may be formed with an appropriate thickness depending on the kind/type of the device to be formed.

Referring again to FIG. 1, a first heat treatment is performed (Block 500).

Figure 6:
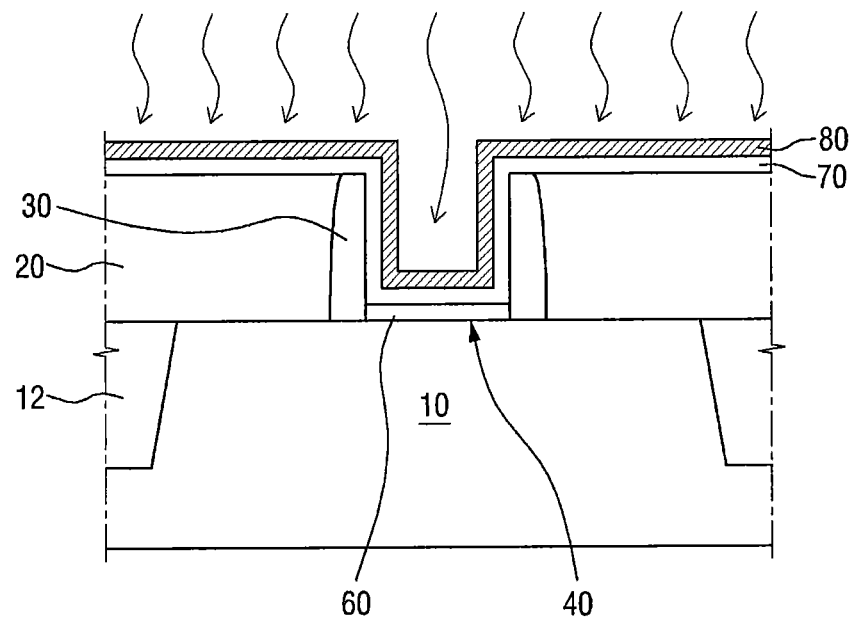

Specifically, referring to FIG. 6, the first heat treatment may be performed in a state where the first metal layer 80 is exposed. That is, the first heat treatment may be performed in a state where an amorphous silicon layer for capping the first metal layer 80 is not provided. The first heat treatment may be performed with respect to the high-k layer 70 and the first metal layer 80.

The first metal layer 80 may be oxidized by oxygen in the atmosphere in a state where the first metal layer 80 is exposed to the atmosphere. That is, an upper surface of the first metal layer 80 that is made of nitride may be changed to oxide through oxidization. For example, if the first metal layer 80 is formed of TiN, an upper surface of the first metal layer 80 may be oxidized to Titanium Monoxide (TiO).

The first heat treatment may function to reduce the oxygen that resulted from oxidization of the first metal layer 80. For example, if the first metal layer 80 is formed of TiN, the upper surface of the first metal layer 80 that has been oxidized to TiO may return to TiN. The oxygen that resulted from oxidization of the first metal layer 80 may be diffused to the high-k layer 70 through a second heat treatment that is subsequently performed. In this case, if the diffused oxygen is excessive, the interface layer 60 that is on the lower portion of the high-k layer 70 may be excessively grown. Accordingly, to prevent/protect against this, it may be beneficial to reduce the amount of oxygen (which resulted from oxidization) in the first metal layer 80, and this may be performed by the first heat treatment.

Specifically, since the interface layer 60 is an oxide layer, mobility of electrons or holes may be changed through such growth. The change of the mobility of electrons or holes may cause the change of a threshold voltage Vt of a transistor. Accordingly, in the fabricating process, a transistor having a different threshold voltage from the originally intended threshold voltage may be produced, and thus reliability of the transistor, that is, the semiconductor device, may cause a problem.

The first heat treatment may be performed using ammonia ($NH_3$) gas. The first heat treatment may be performed at a temperature of about 500° C. to 700° C., but is not limited thereto.

Alternatively, in some embodiments, the first heat treatment may be performed using nitrogen ($N_2$) plasma. In this case, the first heat treatment may be performed at a temperature of about 15° C. to 400° C.

In the case where the first heat treatment is performed using nitrogen ($N_2$) plasma, the nitrogen content in the high-k layer 70 decreases. The high-k layer 70 may subsequently serve as a gate insulating layer of a transistor. If the nitrogen content becomes excessively high, vacancies may be produced in the high-k layer 70 to decrease the mobility of electrons or holes. Accordingly, reliability of the semiconductor device may be decreased. Accordingly, in the case where the first heat treatment is performed using the nitrogen ($N_2$) plasma, the nitrogen content of the high-k layer 70 is reduced, and thus it becomes possible to provide a method for fabricating a semiconductor device having higher reliability.

Referring again to FIG. 1, a second heat treatment is performed (Block 600).

Figure 7:
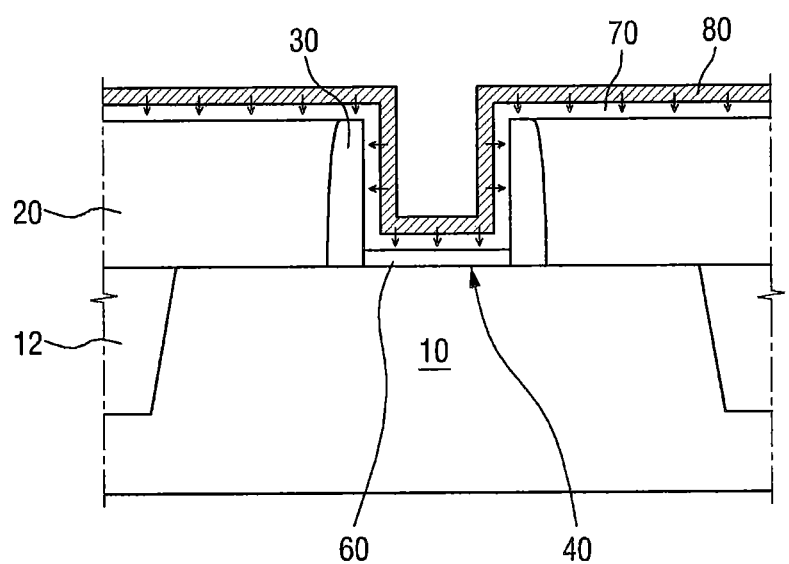

Specifically, referring to FIG. 7, the second heat treatment may be performed with respect to the high-k layer 70 in a state where the first metal layer 80 is exposed. The second heat treatment may be performed for a very short time at a temperature that is higher than the temperature of the first heat treatment.

In the case of the heat treatment whereby the temperature quickly reaches a high peak temperature and then goes down, oxygen included in the first metal layer 80 can be diffused to the high-k layer 70. The high-k layer 70 is an oxide layer, but may include an oxygen vacancy. The oxygen vacancy may exert an influence on mobility of electrons or holes that are carriers. Accordingly, reliability of the semiconductor device may be decreased.

Accordingly, to cure/rectify the oxygen vacancy, the oxygen in the first metal layer 80 can be diffused to the high-k layer 70 through the second heat treatment. In this case, if excessive oxygen is present in the first metal layer 80, the oxygen vacancy can be mostly/entirely cured, and surplus oxygen can be diffused to make the interface layer 60 that is on the lower portion of the high-k layer 70 be excessively grown as described above. Accordingly, reliability of the semiconductor device may be deteriorated.

However, according to the method for fabricating a semiconductor device according to various embodiments of present inventive concepts, the amount of oxygen (which resulted from oxidization) in the first oxidized metal layer 80 can be reduced through the first heat treatment, and the reduced oxygen can be diffused through the second heat treatment to prevent/impede excessive oxygen from being diffused. Accordingly, the interface layer 60 is not excessively grown, thus increasing the reliability of the semiconductor device.

Referring to FIG. 10, the first and second heat treatment processes I and II may be sequentially performed. The first heat treatment I may be performed at a temperature that is lower than the temperature of the second heat treatment II. That is, the first heat treatment I may be performed at $T_2$. Referring to $T_2$, the first heat treatment I may be performed at a temperature of about 500° C. to 700° C. in the case where ammonia gas is used, whereas the first heat treatment I may be performed at a temperature of about 15° C. to 400° C. in the case where nitrogen ($N_2$) plasma is used, but present inventive concepts are not limited thereto.

In the second heat treatment II, the peak temperature may be $T_1$. The peak temperature $T_1$ means the highest temperature of the second heat treatment II. The peak temperature $T_1$ may be higher than the temperature $T_2$ of the first heat treatment I. For example, the peak temperature $T_1$ of the second heat treatment II may be about 800° C. to 1200° C., but is not limited thereto. The first and second heat treatments I and II may be performed by an in-situ process, but present inventive concepts are not limited thereto.

In the second heat treatment II, the temperature may quickly increase to reach the peak temperature $T_1$, and then may quickly go down (decrease) from the peak temperature $T_1$. In the second heat treatment II, the temperature may maintain the peak temperature $T_1$ for a very short time $t_1$, and then may go down (decrease). For example, the time $t_1$ when the temperature of the second heat treatment II maintains the peak temperature may be about 100 microseconds (µs) to 1 second (s), but is not limited thereto. The second heat treatment II may be spike rapid thermal annealing (sRTA), laser anneal, flash anneal, or a combination thereof. As shown in the graph of FIG. 10, the slope of the heat treatment temperature that descends may be slower than the slope of the heat treatment temperature that ascends, but is not limited thereto.

To adjust the amount of oxygen that is diffused to the high-k layer 70, an amorphous silicon capping layer may be formed on an upper portion of the first metal layer 80. However, the amorphous silicon capping layer may form a reaction layer, which may not be easily removed, through reaction with the first metal layer 80 that is made of TiN, and it may be necessary to remove the reaction layer through an etching process that is separate from the etching process of the amorphous silicon capping layer. Accordingly, the process using the amorphous silicon capping layer may include a step of depositing the amorphous silicon capping layer, a step of removing the amorphous silicon capping layer, and a step of removing the silicon and the reaction layer of the first metal layer 80, and this may cause severe waste (e.g., inefficient use) of processes.

In contrast, according to a method for fabricating a semiconductor device according to various embodiments of present inventive concepts, the heat treatment is immediately performed without performing a deposition process of an amorphous silicon capping layer. Accordingly, waste of processes can be reduced, and a semiconductor device having little/reduced defects can be provided. That is, since high-temperature heat treatment is rapidly performed, all of the steps of forming an amorphous silicon capping layer, removing the amorphous silicon capping layer, and removing the silicon and the reaction layer of the first metal layer 80 can be omitted to provide more efficient processes.

Next, referring to FIG. 1, a second metal layer is formed (Block 700).

Figure 8:
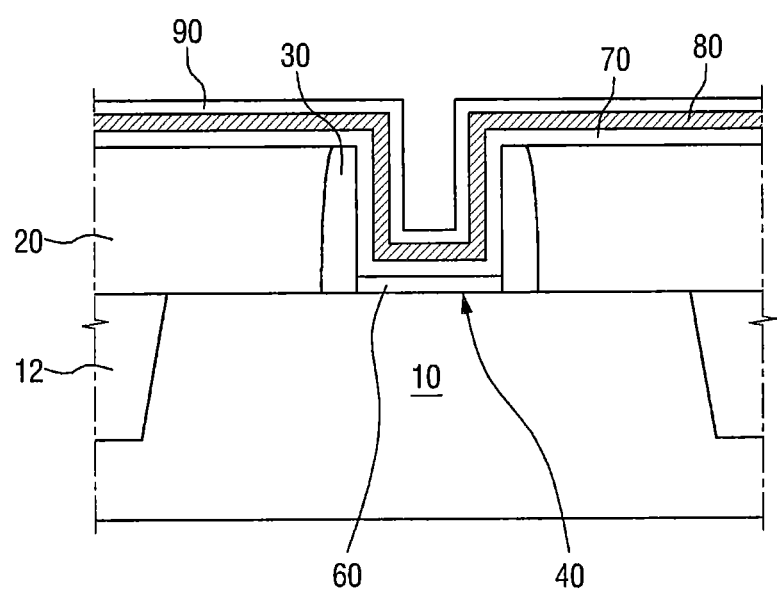

Referring to FIG. 8, after the second heat treatment, the second metal layer 90 may be formed on the first metal layer 80. The second metal layer 90 may be formed on the first metal layer 80 in the trench 40. As illustrated, the second metal layer 90 may be conformally formed along the side wall(s) and the bottom surface of the trench 40. The second metal layer 90 may include metal nitride. The second metal layer 90 may be made of a material that is different from the material of the first metal layer 80. The second metal layer 90 may include, for example, any one of TiN, TaN, and WN. Here, the second metal layer 90 may be an etch prevention/protection layer that is formed to assist with removal of a work function adjustment layer that is to be subsequently removed.

After the second metal layer 90 is formed, a work function adjustment layer may be formed to adjust the threshold voltage Vt of a semiconductor device (e.g., transistor). If the conductivity type of the semiconductor device (e.g., transistor) is, for example, N-type, the work function adjustment layer may be an N-type work function adjustment layer. Examples of such an N-type work function adjustment layer may be Titanium Aluminide (TiAl), Titanium Aluminum Nitride (TiAlN), Tantalum Carbide (TaC), Tantalum Aluminum Nitride (TaAlN), Titanium Carbide (TiC), and Hafnium Silicide (HfSi), but are not limited thereto.

On the other hand, if the conductivity type of the semiconductor device (e.g., transistor) is, for example, P-type, the work function adjustment layer may be a P-type work function adjustment layer. An example of such a P-type work function adjustment layer may be, for example, TiN, but is not limited thereto.

In some embodiments of present inventive concepts, the work function adjustment layer may be a combination of the above-described work function adjustment layers. That is, the work function adjustment layer may have a double-layer structure in which a P-type work function adjustment layer defines the lower portion thereof and an N-type work function adjustment layer defines the upper portion thereof.

Specifically, in the case of the double-layer structure in which a P-type work function adjustment layer defines the lower portion thereof and an N-type work function adjustment layer defines the upper portion thereof, the transistor is of a P-type, and thus in the case of simultaneously fabricating a P-type transistor and an N-type transistor, the N-type work function adjustment layer may be formed on both the P-type transistor and the N-type transistor to improve the process efficiency. In this case, since the P-type work function adjustment layer should not be formed in the trench for the N-type transistor, a process of generating a P-type work function adjustment layer and then selectively removing the generated P-type work function adjustment layer may be necessary. In this case, the second metal layer 90 may be used to prevent/protect against wet etching of the first metal layer 80.

Figure 9:
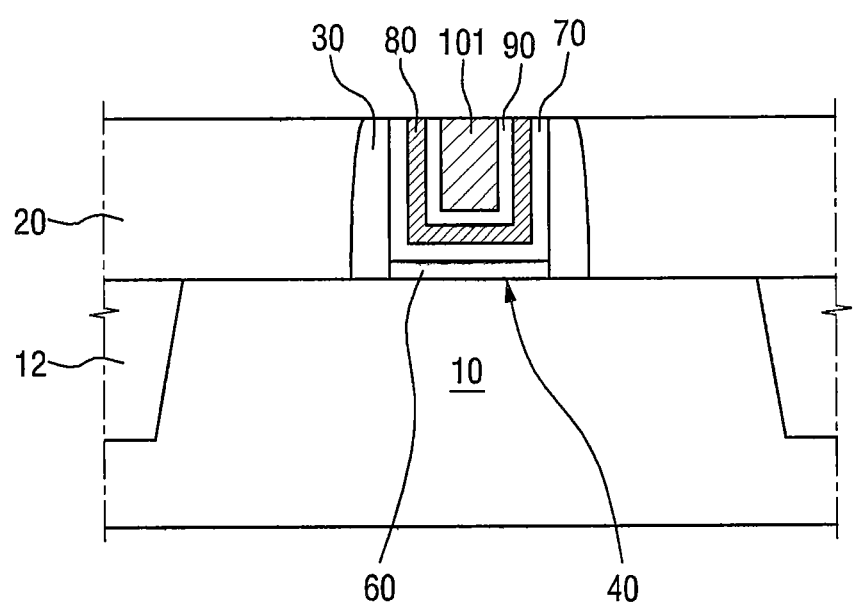
Figure 10:
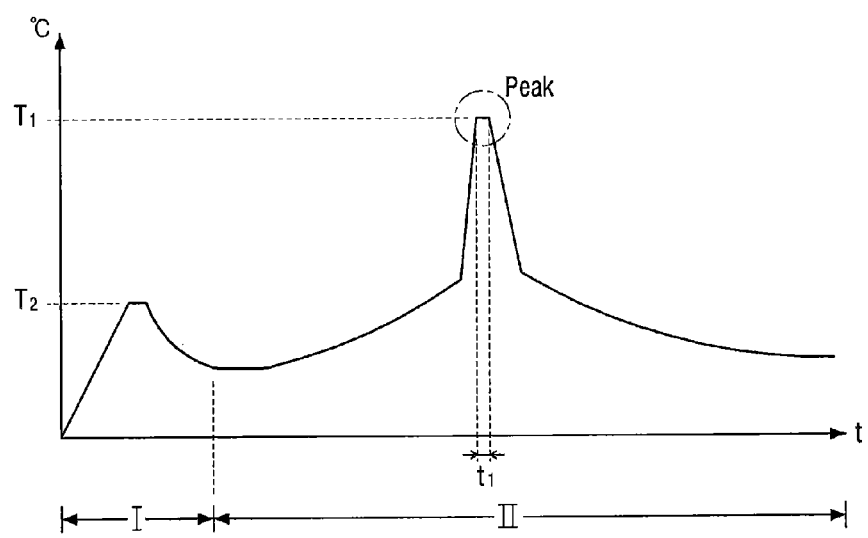
FIG. 10 is a time-temperature graph explaining first and second heat treatment processes in a method for fabricating a semiconductor device according to various embodiments of present inventive concepts.

Then, referring to FIG. 9, a gate electrode structure 101 may be formed on the work function adjustment layer. The gate electrode structure 101 may be made of a conductive metal material, for example, Aluminum (Al) or Tungsten (W), or may have a multilayer structure including a combination of conductive metal materials.

Then, the gate electrode structure 101, the work function adjustment layer, the second metal layer 90, the first metal layer 80, and the high-k layer 70 are planarized until the upper surface of the interlayer insulating layer 20 is exposed. Accordingly, the work function adjustment layer, the second metal layer 90, the first metal layer 80, and the high-k layer 70 may be formed to extend upward along opposing spacer 30 sidewalls.

Hereinafter, referring to FIGS. 11 to 13, a method for fabricating a semiconductor device according to some embodiments of present inventive concepts will be described. Repeated descriptions of elements/processes described above may be omitted or simplified.

Figure 11:
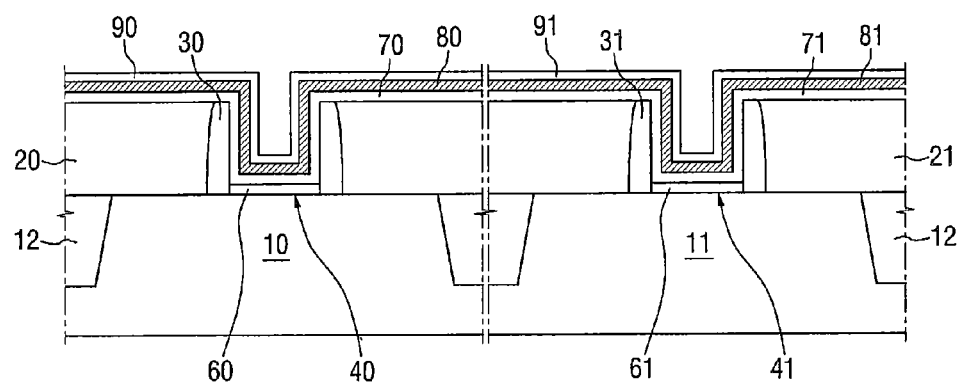
FIGS. 11 to 13 are views of intermediate steps explaining a method for fabricating a semiconductor device according to various embodiments of present inventive concepts.
Figure 12:
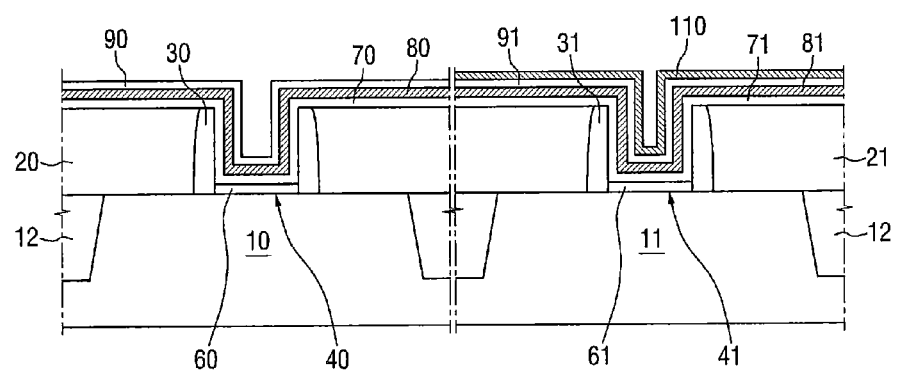
Figure 13:
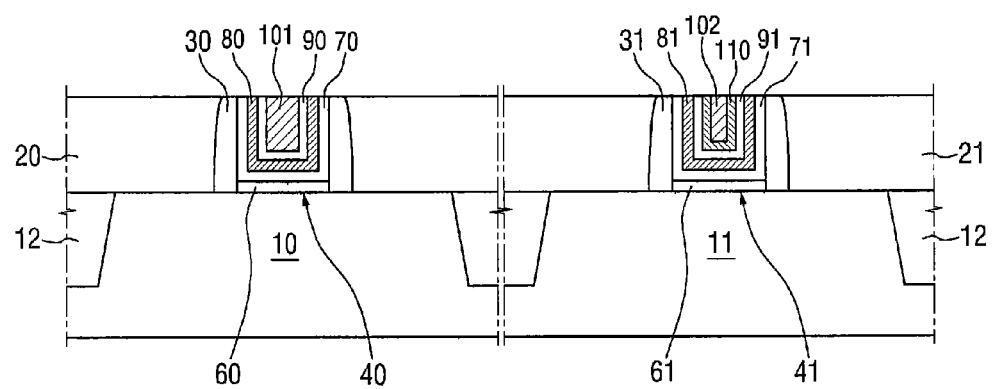

FIGS. 11 to 13 are views of intermediate steps explaining a method for fabricating a semiconductor device according to some embodiments of present inventive concepts.

Referring to FIG. 11, a semiconductor device, which is the same as/based on the semiconductor device on which the second metal layer 90 is formed according to FIG. 8, has a first region and a second region. In particular, the first region 10 and the second region 11 provide/define a divided substrate. Then, an isolation layer 12 is formed thereon.

In the first region 10, in the same manner (or a similar manner) as described with respect to FIGS. 1-3, an interlayer insulating layer 20 that includes a first trench 40 is formed, and a first spacer 30 is formed on a side surface of the first trench 40. Moreover, an interface layer 60 is formed on the bottom of the first trench 40, and a high-k layer 70, a first metal layer 80, and an etch prevention/protection layer 90 are conformally formed thereon in order. In the same manner (or a similar manner) as described with respect to FIGS. 1 and 6-8, first and second heat treatments are performed with respect to the high-k layer 70 and the first metal layer 80, and then the etch prevention/protection layer 90 is formed thereon.

In the second region 11, in the same manner (or a similar manner) as described with respect to FIGS. 1-3, an interlayer insulating layer 21 that includes a second trench 41 is formed, and a second spacer 31 is formed on a side surface of the second trench 41. An interface layer 61 is formed on the bottom of the second trench 41, and a high-k layer 71, a first metal layer 81, and an etch prevention/protection layer 91 are conformally formed thereon in order. In the same manner (or a similar manner) as described with respect to FIGS. 1 and 6-8, first and second heat treatments are performed with respect to the high-k layer 71 and the first metal layer 81, and then the etch prevention/protection layer 91 is formed thereon.

Then, referring to FIG. 12, a second metal layer 110 is formed on the etch prevention/protection layer 91 of the second region 11, but does not remain in the first region 10. Specifically, the second metal layer 110 may be formed on the etch prevention/protection layers 90 and 91 of the first region 10 and the second region 11, respectively, and then may be selectively removed. That is, the second metal layer 110 of the first region 10 may be etched to be removed. In this case, the etching of the second metal layer 110 may be wet etching.

The etch prevention/protection layers 90 and 91 may be formed to protect the first metal layer 80 during the wet etching. The etch prevention/protection layers 90 and 91 may include a metal nitride. For example, the etch prevention/protection layers 90 and 91 may include at least one of TiN, TaN, and WN.

After the second metal layer 110 of the first region 10 is removed, only the second metal layer 110 of the second region 11 remains. The second metal layer 110 of the second region 11 may be a first conductivity type work function adjustment layer. Here, the first conductivity type may be P-type.

Then, a second conductivity type work function adjustment layer may be formed on the first region 10 and the second region 11. The second conductivity type may be N-type.

Referring to FIG. 13, gate electrode structures 101 and 102 may be formed on the second conductivity type work function adjustment layers of the first region 10 and the second region 11. The gate electrode structures 101 and 102 may be made of a conductive metal material, for example, Al or W, or may have a multilayer structure including a combination of conductive metal materials, but are not limited thereto.

Then, the gate electrode structures 101 and 102, the second conductivity type work function adjustment layer, the second metal layer 110 that is the first conductivity type work function adjustment layer, the first metal layers 80 and 81, the etch prevention/protection layers 90 and 91, and the high-k layers 70 and 71 are planarized until the upper surfaces of the interlayer insulating layers 20 and 21 are exposed. Accordingly, the gate electrode structures 101 and 102, the second conductivity type work function adjustment layer, the second metal layer 110 that is the first conductivity type work function adjustment layer, the first metal layers 80 and 81, the etch prevention/protection layers 90 and 91, and the high-k layers 70 and 71 may be formed to extend upward along opposing side walls of the first and second spacers 30 and 31.

Unlike the first region 10, the second region 11 may further include the second metal layer 110. The second metal layer 110 may be positioned between the etch prevention/protection layer 91 and the first conductivity type work function adjustment layer, and may be conformally formed along the side wall(s) and the bottom surface of the second trench 41. For example, the first conductivity type work function adjustment layer may include an N-type work function adjustment layer, and the second conductivity type work function adjustment layer, that is, the second metal layer 110, may include a P-type work function adjustment layer. Further, the first conductivity type work function adjustment layer may be a TiAl layer, and the second conductivity type work function adjustment layer, that is, the second metal layer 110, may be a TiN layer. Since the transistor of the second region 11 includes the second metal layer 110, it may have a transistor operation characteristic that is different from that of the transistor of the first region 10.

Hereinafter, referring to FIGS. 14 and 15, an example of a semiconductor device fabricated according to various embodiments of present inventive concepts will be described.

Figure 14:
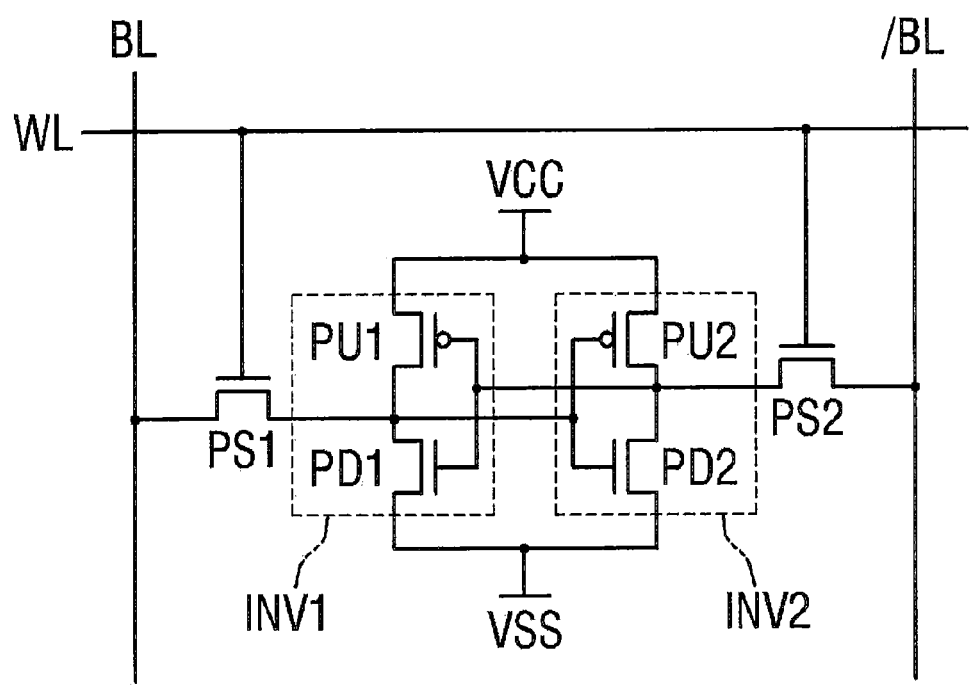
FIGS. 14 and 15 are diagrams illustrating an example of a semiconductor device fabricated according to various embodiments of present inventive concepts.
Figure 15:
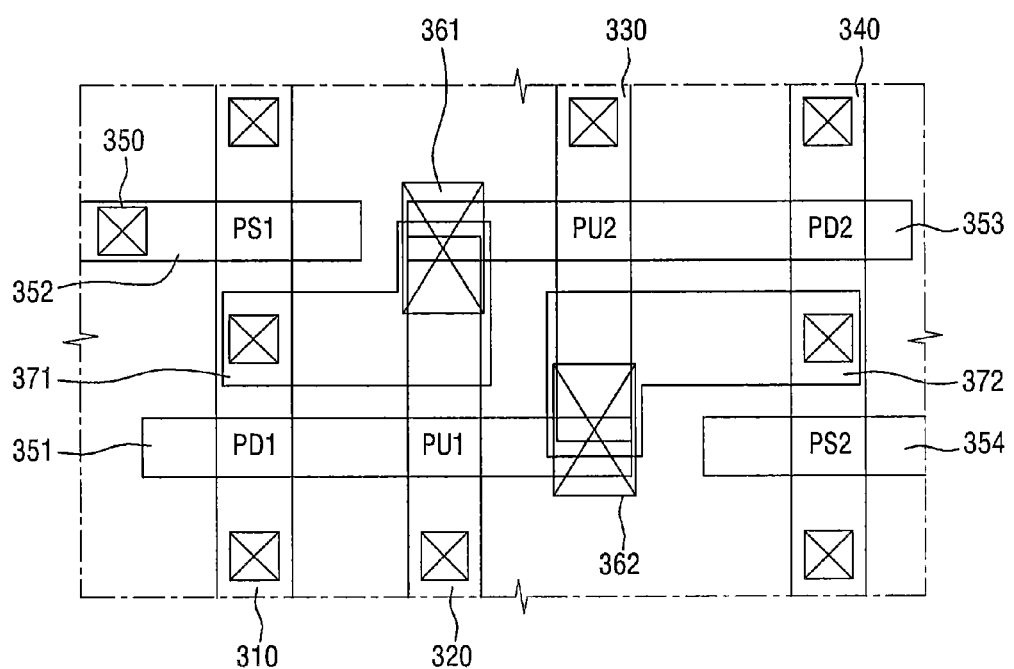

FIGS. 14 and 15 are diagrams illustrating an example of a semiconductor device fabricated according to various embodiments of present inventive concepts.

Referring to FIGS. 14 and 15, a semiconductor device 9 fabricated according to various embodiments of present inventive concepts may include a pair of inverters INV1 and INV2 connected in parallel between a power supply node Vcc and a ground node Vss, a first pass transistor PS1 and a second pass transistor PS2 connected to output nodes of the respective inverters INV1 and INV2. The first pass transistor PS1 and the second pass transistor PS2 may be connected to a bit line BL and a complementary bit line/BL, respectively. Gates of the first pass transistor PS1 and the second pass transistor PS2 may be connected to a word line WL.

The first inverter INV1 includes a first pull-up transistor PU1 and a first pull-down transistor PD1 which are connected in series, and the second inverter INV2 includes a second pull-up transistor PU2 and a second pull-down transistor PD2 which are connected in series. The first pull-up transistor PU1 and the second pull-up transistor PU2 may be PMOS transistors, and the first pull-down transistor PD1 and the second pull-down transistor PD2 may be NMOS transistors.

Further, the first inverter INV1 and the second inverter INV2 may constitute one latch circuit in a manner that an input node of the first inverter INV1 is connected to an output node of the second inverter INV2, and an input node of the second inverter INV2 is connected to an output node of the first inverter INV1.

Here, referring to FIGS. 14 and 15, a first active region 310, a second active region 320, a third active region 330, and a fourth active region 340, which are spaced apart from each other, are formed to extend long in one direction (for example, upper/lower direction in FIG. 7). The extending length of the second active region 320 and the third active region 330 may be shorter than the extending length of the first active region 310 and the fourth active region 340.

Further, a first gate electrode 351, a second gate electrode 352, a third gate electrode 353, and a fourth gate electrode 354 extend long in the other direction (for example, right/left direction in FIG. 11), and are formed to cross the first to fourth active regions 310 to 340. Specifically, the first gate electrode 351 may be formed to completely cross the first active region 310 and the second active region 320 and to overlap a part of a vertical end of the third active region 330. The third gate electrode 353 may be formed to completely cross the fourth active region 340 and the third active region 330 and to overlap a part of a vertical end of the second active region 320. The second gate electrode 352 and the fourth gate electrode 354 may be formed to cross the first active region 310 and the fourth active region 340, respectively.

As illustrated, the first pull-up transistor PU1 is defined around a region where the first gate electrode 351 and the second active region 320 cross each other, the first pull-down transistor PD1 is defined around a region where the first gate electrode 351 and the first active region 310 cross each other, and the first pass transistor PS1 is defined around a region where the second gate electrode 352 and the first active region 310 cross each other. The second pull-up transistor PU2 is defined around a region where the third gate electrode 353 and the third active region 330 cross each other, the second pull-down transistor PD2 is defined around a region where the third gate electrode 353 and the fourth active region 340 cross each other, and the second pass transistor PS2 is defined around a region where the fourth gate electrode 354 and the fourth active region 340 cross each other.

The source/drain may be formed on both sides of a region where the first to fourth gate electrodes 351 to 354 and the first to fourth active regions 310, 320, 330, and 340 cross each other.

Further, a plurality of contacts 350 may be formed.

In addition, a shared contact 361 simultaneously connects the second active region 320, the third gate electrode 353, and a wiring 371. A shared contact 362 simultaneously connects the third active region 330, the first gate electrode 351, and a wiring 372.

For example, the first pull-up transistor PU1 and the second pull-up transistor PU2 may have a configuration explained using the second region 11 of FIGS. 11-13, and the first pull-down transistor PD1, the first pass transistor PS1, the second pull-down transistor PD2, and the second pass transistor PS2 may have a configuration explained using FIG. 5.

Figure 16:
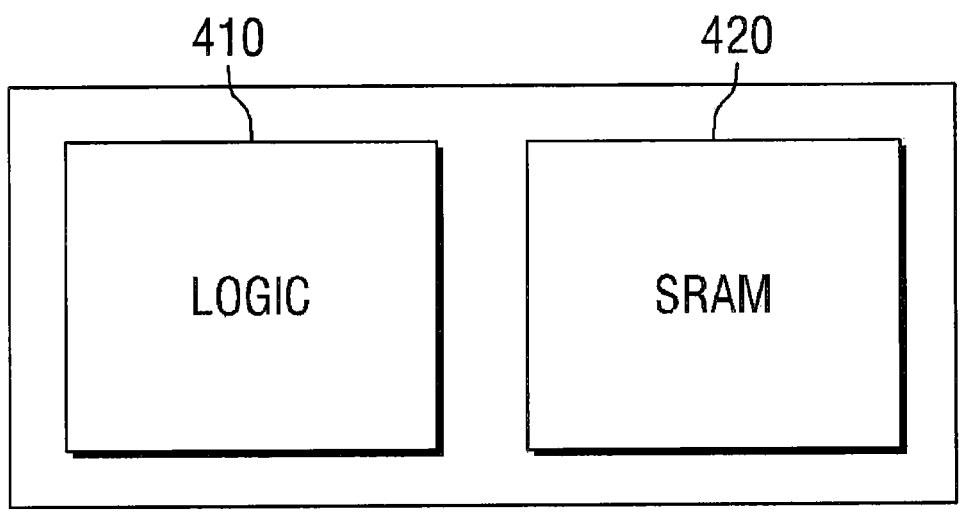
FIG. 16 is a diagram illustrating an example of a semiconductor device fabricated according to various embodiments of present inventive concepts.

FIG. 16 is a diagram illustrating an example of a semiconductor device fabricated according to various embodiments of present inventive concepts.

Referring to FIG. 16, a semiconductor device fabricated according to various embodiments of present inventive concepts may include a logic region 410 and a Static Random Access Memory (SRAM) region 420.

In some embodiments, the structure explained using FIG. 16 may be applied to the logic region 410, but may not be applied to the SRAM region 420.

Further, the structure explained using FIG. 16 may be applied to both the logic region 410 and the SRAM region 420.

Further, the structure explained using FIG. 16 may be applied to the SRAM region 420, but may not be applied to the logic region 410.

FIG. 16 illustrates an example of the logic region 410 and the SRAM region 420, but present inventive concepts are not limited thereto. For example, present inventive concepts may also be applied to a region where a memory that is different from the logic region 410 is formed (e.g., Dynamic Random Access Memory (DRAM), Magnetoresistive Random Access Memory (MRAM), Resistive Random Access Memory (RRAM), or Phase Change Random Access Memory (PRAM)).

Figure 17:
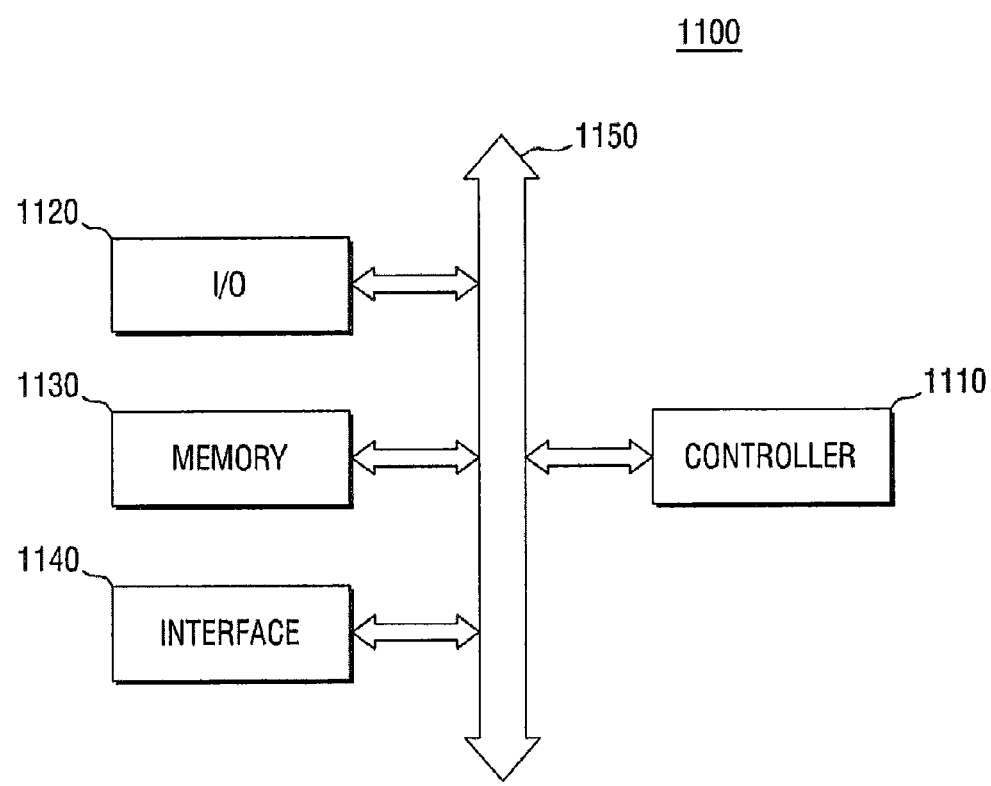
FIG. 17 is a block diagram of an electronic system including a semiconductor device fabricated according to various embodiments of present inventive concepts.

FIG. 17 is a block diagram of an electronic system including a semiconductor device fabricated according to various embodiments of present inventive concepts.

Referring to FIG. 17, an electronic system 1100 according to various embodiments of present inventive concepts may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that can perform similar functions. The I/O device 1120 may include a keypad, a keyboard, and/or a display device. The memory 1130 may store data and/or commands. The interface 1140 may function to transfer the data to a communication network or receive the data from the communication network. The interface 1140 may be of a wired or wireless type. For example, the interface 1140 may include an antenna or a wired/wireless transceiver. The electronic system 1100 may further include a high-speed DRAM and/or SRAM as an operating memory for improving the operation of the controller 1110. A fin field-effect transistor according to various embodiments of present inventive concepts may be provided inside the memory 1130 or may be provided as a part of the controller 1110 and the I/O device 1120.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 18:
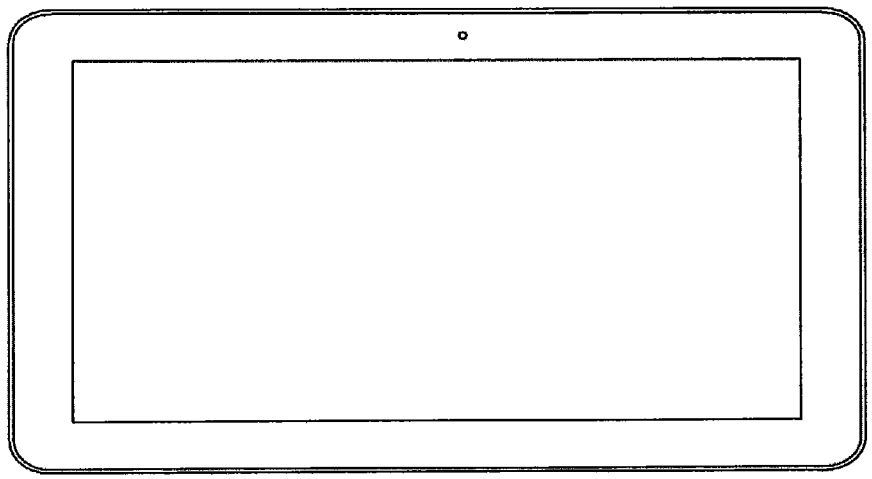
FIGS. 18 and 19 are exemplary views illustrating a semiconductor system that can adopt a semiconductor device according to a method for fabricating a semiconductor device according to various embodiments of present inventive concepts.
Figure 19:
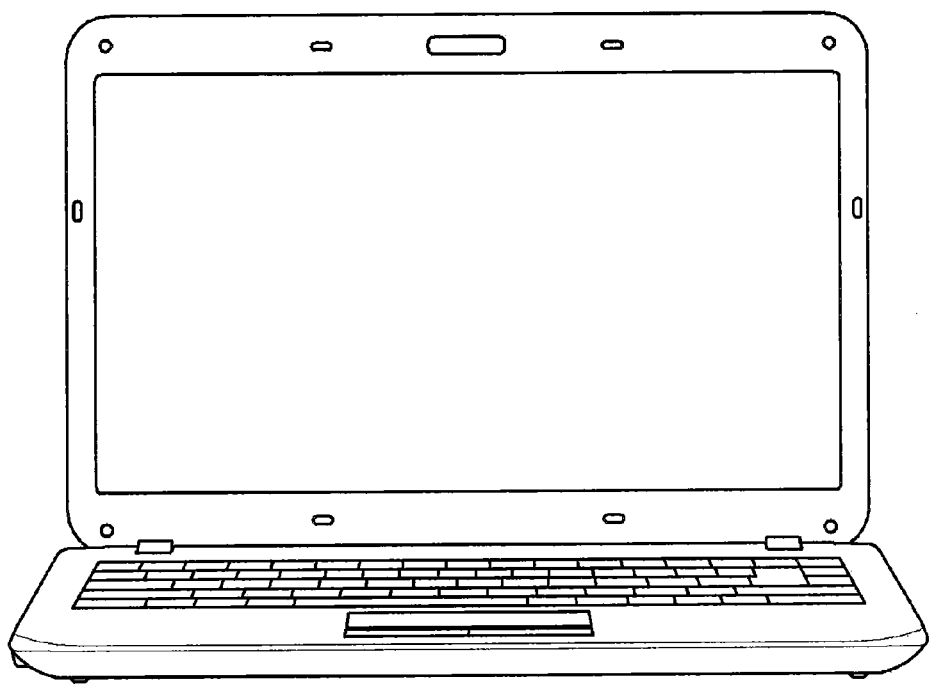

FIGS. 18 and 19 are example views illustrating a semiconductor system that can adopt a semiconductor device according to a method for fabricating a semiconductor device according to some embodiments of present inventive concepts. FIG. 18 illustrates a tablet computer (e.g., a tablet Personal Computer (PC) or other tablet computer), and FIG. 19 illustrates a notebook computer (e.g., a notebook PC or other notebook computer). At least one of the semiconductor devices according to various embodiments of present inventive concepts may be used in the tablet computer or the notebook computer. It will be understood by those skilled in the art, however, that a semiconductor device according to some embodiments of present inventive concepts can be applied even to other integrated circuit devices that have not been described in examples herein.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method for fabricating a semiconductor device, the method comprising:
    forming an interlayer insulating layer comprising a trench therein on a substrate;
    forming an interface layer in the trench;
    forming a high-k layer in the trench,
        wherein the high-k layer is on the interface layer and extends on a sidewall of the trench;
    forming a first metal layer on the high-k layer,
        wherein the first metal layer extends on the sidewall of the trench, and
        wherein the first metal layer comprises an oxidized portion;
            performing a first heat treatment with respect to the high-k layer and the first metal layer at a first temperature when a surface of the first metal layer is exposed,
        wherein the first heat treatment reduces oxygen in the oxidized portion of the first metal layer;
    performing a second heat treatment using a peak second temperature that is higher than the first temperature with respect to the high-k layer when the surface of the first metal layer is exposed,
    wherein the second heat treatment diffuses oxygen from the first metal layer into the high-k layer;
    forming a second metal layer on the first metal layer; and
    forming a gate electrode structure on the second metal layer.

2. The method of claim 1, wherein performing the second heat treatment comprises maintaining the peak second temperature for about 100 microseconds to about 1 second.

3. The method of claim 2,
    wherein the peak second temperature comprises about 800° C. to about 1200° C., and
    wherein performing the second heat treatment comprises performing the second heat treatment using the peak second temperature of about 800° C. to about 1200° C.

4. The method of claim 1,
    wherein the first metal layer comprises metal nitride, and
    wherein forming the first metal layer comprises forming the metal nitride on the high-k layer.

5. The method of claim 4, wherein the metal nitride comprises Titanium Nitride (TiN), Tantalum Nitride (TaN), Tungsten Nitride (WN), or a combination thereof.

6. The method of claim 4, wherein the second metal layer comprises a material that is different from the metal nitride of the first metal layer.

7. The method of claim 1, wherein performing the first heat treatment comprises performing the first heat treatment using ammonia ($NH_3$) gas.

8. The method of claim 7, wherein the first heat treatment is performed at a temperature of about 500° C. to about 700° C.

9. The method of claim 1, wherein performing the first heat treatment comprises performing the first heat treatment using nitrogen ($N_2$) plasma.

10. The method of claim 1, wherein the second heat treatment diffuses oxygen from the first metal layer into a first portion of the high-k layer on the interface layer and into a second portion of the high-k layer extending on the sidewall of the trench.

11. The method of claim 10, wherein the high-k layer extends on the interlayer insulating layer beside the trench,
    wherein the second heat treatment diffuses oxygen from the first metal layer into a third portion of the high-k layer on the interlayer insulating layer, the method further comprising:
    after forming the gate electrode structure on the second metal layer, removing the third portion of the high-k layer.

12. A method for fabricating a semiconductor device, the method comprising:
    providing a substrate that comprises a first region and a second region;
    forming an interlayer insulating layer that comprises a first trench and a second trench on the first region and the second region, respectively;
    forming a high-k layer in the first trench and the second trench;
    forming a first metal layer on the high-k layer,
        wherein the first metal layer comprises a first segment in the first region and a second segment in the second region, and
        wherein the first metal layer comprises an oxidized portion;
    performing a first heat treatment with respect to the high-k layer at a first temperature when a surface of the first metal layer is exposed,
        wherein the first heat treatment reduces oxygen in the oxidized portion of the first metal layer;
    performing a second heat treatment using a peak second temperature that is higher than the first temperature with respect to the high-k layer when the surface of the first metal layer is exposed,
    wherein the second heat treatment diffuses oxygen from the first metal layer into the high-k layer;
    forming a second metal layer on the first metal layer; and
    removing the second metal layer from the first segment of the first metal layer in the first region while at least a portion of the second metal layer remains on the second segment of the first metal layer in the second region.

13. The method of claim 12, further comprising forming an etch protection layer that comprises Tantalum Nitride (TaN), on the first metal layer in the first and second regions, before forming the second metal layer,
    wherein forming the second metal layer comprises forming the second metal layer on the etch protection layer of the first and second regions, and
    wherein removing the second metal layer comprises selectively removing the second metal layer from the first region by wet etching.

14. The method of claim 13,
wherein the second metal layer comprises a first conductivity type work function adjustment layer, and
wherein the method further comprises forming a second conductivity type work function adjustment layer on the etch protection layer of the first region and the second metal layer of the second region.

15. The method of claim 14,
wherein the first conductivity type comprises P-type, and
wherein the second conductivity type comprises N-type.

16. A method of forming a semiconductor device, the method comprising:
forming an interface layer in a trench in an insulating layer;
forming a high-k layer on the interface layer in the trench;
forming a metal layer on the high-k layer in the trench,
wherein the metal layer extends on a sidewall of the trench, and
wherein the metal layer comprises an oxidized portion;
performing a first heat treatment using a first temperature, after forming the metal layer on the high-k layer in the trench,
wherein the first heat treatment reduces oxygen in the oxidized portion of the metal layer; and
performing a second heat treatment using a second temperature that is higher than the first temperature of the first heat treatment, after performing the first heat treatment,
wherein the second heat treatment diffuses oxygen from the metal layer into the high-k layer.

17. The method of claim 16,
wherein the second temperature comprises a peak temperature of about 800° C. to about 1200° C., and
wherein performing the second heat treatment comprises performing the second heat treatment using the peak temperature of about 800° C. to about 1200° C. for about 100 microseconds to about 1 second.

18. The method of claim 16,
wherein the metal layer comprises a first metal layer, and
wherein the method further comprises:
forming a second metal layer in the trench after performing the first and second heat treatments;
forming a P-type work function adjustment layer after forming the second metal layer; and
forming an N-type work function adjustment layer on the P-type work function adjustment layer.

19. The method of claim 16,
wherein the trench comprises a first trench,
wherein the semiconductor device further comprises a second trench in the insulating layer,
wherein the metal layer comprises a first metal layer, and
wherein the method further comprises:
forming a second metal layer in the first and second trenches; and
completely removing the second metal layer from the first trench without completely removing the second metal layer from the second trench.

20. The method of claim 16, wherein the high-k layer extends on the sidewall of the trench, and
wherein the second heat treatment diffuses oxygen from the first metal layer into a first portion of the high-k layer on the interface layer and into a second portion of the high-k layer extending on the sidewall of the trench.

* * * * *